(12) United States Patent
Kanda et al.

(10) Patent No.: US 6,959,125 B2
(45) Date of Patent: Oct. 25, 2005

(54) PRINTED BOARD UNIT FOR OPTICAL TRANSMISSION AND MOUNTING METHOD

(75) Inventors: Takashi Kanda, Kawasaki (JP);
Kiyotaka Seyama, Kawasaki (JP);
Kaoru Sugimoto, Kawasaki (JP);
Souichi Obata, Kawasaki (JP);
Yasutomo Maehara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 199 days.

(21) Appl. No.: 10/341,437

(22) Filed: Jan. 14, 2003

(65) Prior Publication Data
US 2003/0228084 A1   Dec. 11, 2003

(30) Foreign Application Priority Data
Jun. 6, 2002   (JP) .............................. 2002-166030

(51) Int. Cl.[7] .............................. G02B 6/12; G02B 6/42
(52) U.S. Cl. .............................. 385/14; 385/88; 385/89
(58) Field of Search .............................. 385/14, 88–92; 257/778

(56) References Cited

U.S. PATENT DOCUMENTS

| | | | |
|---|---|---|---|
| 5,513,288 A * | 4/1996 | Mayer | 385/30 |
| 6,330,377 B1 | 12/2001 | Kosemura | |
| 6,739,761 B2 * | 5/2004 | Tsukamoto et al. | 385/89 |
| 6,759,687 B1 * | 7/2004 | Miller et al. | 257/98 |
| 2004/0057648 A1 * | 3/2004 | Yunus | 385/14 |
| 2005/0013557 A1 * | 1/2005 | Lu | 385/90 |

FOREIGN PATENT DOCUMENTS

| | | | | |
|---|---|---|---|---|
| JP | 9-26530 | 1/1997 | | |
| JP | 2000-81524 | 3/2000 | | |
| JP | 2003215371 A | * | 7/2003 | ........ G02B 6/122 |

* cited by examiner

Primary Examiner—Rodney Bovernick
Assistant Examiner—Omar Rojas
(74) Attorney, Agent, or Firm—Westerman, Hattori, Daniels & Adrian, LLP

(57) ABSTRACT

It is an object of the present invention to enhance laser beam transmitting efficiency by accurately controlling an interval between a light emitting (light receiving) element (20) and an optical wave-guide substrate (1) without causing any fluctuation in the interval in a mounting structure of the light transmitting element in which the light emitting (light receiving) element (20) is mounted on the optical wave-guide substrate (1). When the light emitting (light receiving) element is joined to the sub-mount chip (4) and when the sub-mount chip (4) is joined to the optical wave-guide while the element is being directed to the substrate side, the sub-mount chip and the optical wave-guide substrate are joined to each other by the solder bump (6). A post (5) is arranged for regulating an interval between the light emitting (light receiving) element and the optical wave-guide substrate.

8 Claims, 7 Drawing Sheets

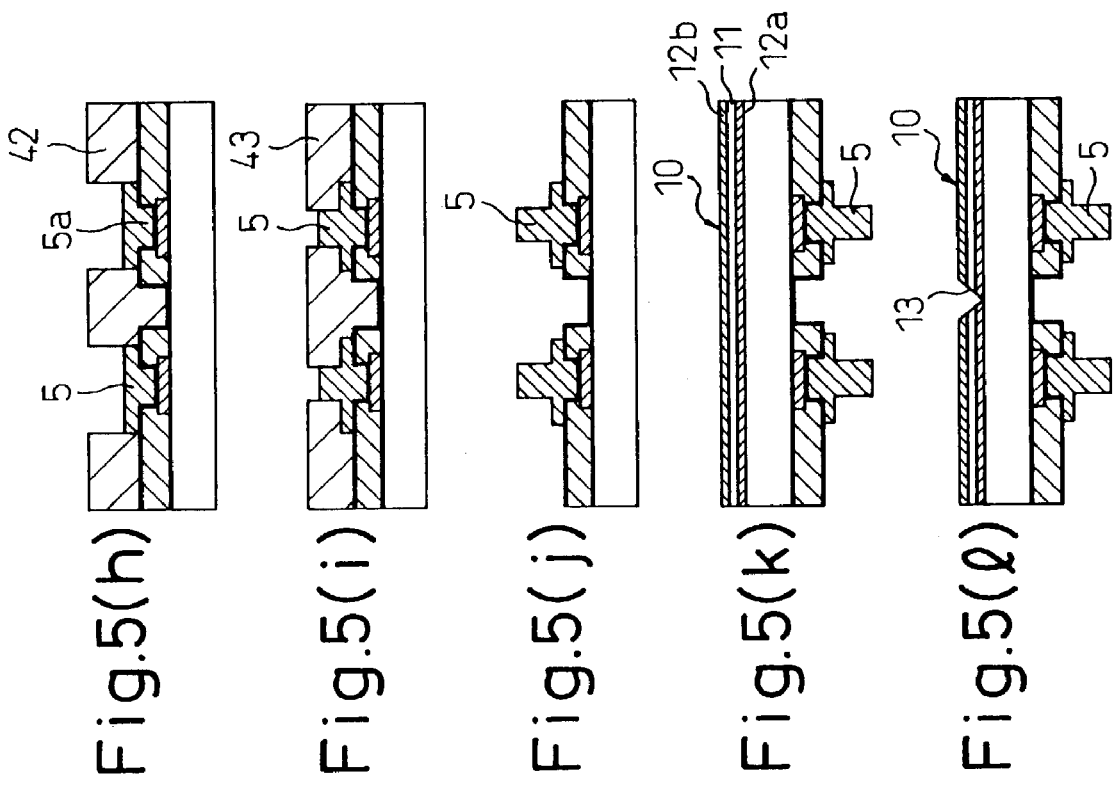

PRINTED BOARD UNIT FOR OPTICAL TRANSMISSION AND MOUNTING METHOD

BACKGROUND OF THE INVENTION

1. Field of the Invention

The present invention generally relates to an optical transmission device. More particularly, the present invention relates to a mounting structure or a printed board unit for optical transmission, and a mounting method of mounting a surface light emitting (light receiving) semiconductor element, which emits or receives a laser beam used for optical transmission, on an optical wave-guide substrate.

2. Description of the Related Art

The following prior art is known.

Japanese Unexamined Patent Publication No. 9-26530 discloses the following technique. In an optical module in which optical elements of surface light emitting (light receiving) type and optical fibers are arranged on a plane of the same mounting substrate, the optical module having an optical coupling system, in which an optical path is converted on a side of a stationary groove of the optical fibers, in order to stabilize the characteristic and reduce the manufacturing cost, a surface light emitting element (for example, an LED) is first mounted on a sub-substrate via a bump, and then the sub-substrate is mounted on the mounting substrate via another bump.

The prior art disclosed in Japanese Unexamined Patent Publication No. 9-26530 has the following problems. A surface light emitting element (for example, an LED) is first mounted on a sub-substrate via a first bump, and then this sub-substrate is mounted on a mounting substrate via a second bump. Therefore, the distance between the sub-substrate and the mounting substrate is determined by the size of the second bump. Therefore, when the size of the second bump fluctuates, the interval between the sub-substrate and the mounting substrate for each optical module fluctuates and, further, the distance between the light emitting (light receiving) element and the optical fiber fluctuates. Accordingly, the light emitting or light receiving characteristic is changed, so that the performance of the individual optical module can not be stabilized. Further, there is a problem in which a gap formed between the light emitting (light receiving) element and the optical wave-guide substrate 1 can be clogged with dirt and dust.

In the conventional system shown in FIG. 1, the following problems may be encountered. A gap corresponding to the height of the solder bump 6 is necessarily made between the light emitting (light receiving) element and the substrate. Therefore, the distance between the element light emitting (light receiving) section 20b of the element and the optical wave-guide 10 right below the substrate is extended.

SUMMARY OF THE INVENTION

It is an object of the present invention to provide a mounting structure for mounting a surface light emitting (light receiving) element on an optical wave-guide substrate characterized in that: the gap between the light emitting (light receiving) element and the optical wave-guide substrate does not fluctuate, so that the interval can be accurately controlled and the transmitting efficiency of a laser beam can be enhanced; and the gap cannot be clogged with dirt and dust.

In the mounting structure for mounting an element for optical transmission of the present invention, a reverse side electrode of the light emitting (light receiving) element is joined to an electrode of a sub-mount chip. In this case, conductive adhesive or solder is used as material for joining. As a pad for connecting the sub-mount chip with a substrate, a solder bump used for positioning is formed and what is called a "Face-down C4 junction" is conducted on the substrate by the flip chip bonding system. A diffused junction conducted by a copper (Cu) post formed on the substrate pad is used for connecting the pad of the light emitting (light receiving) element with the substrate pad. On a surface of the Cu post, a plated layer is formed, the melting point of which is equal to or not more than the melting point of the solder bump.

According to the present invention, the surface light emitting type light emitting (light receiving) element can be joined by a C4-junction to the optical wave guide substrate via a sub-mount chip while being handled as a common flip chip. In the junction, highly accurate position control (not more than 5 μm) and height control (not more than 10 μm) can be simultaneously realized by the self alignment function in the melting process of the solder bump for positioning formed on the sub-mount chip and also by the stand-off function of the Cu post formed on the substrate pad. In this connection, the solder bump for positioning can be also used as an electrode for connecting the substrate.

BRIEF DESCRIPTION OF THE DRAWINGS

FIGS. 5(a) to 5(l) are views showing a process of manufacturing an optical wave-guide substrate;

DETAILED DESCRIPTION OF THE PREFERRED EMBODIMENTS

By referring to the accompanying drawings, embodiments of the present invention will be explained below.

Before the explanations of the embodiments of this invention, one of comparative examples will be described.

Figure 1:
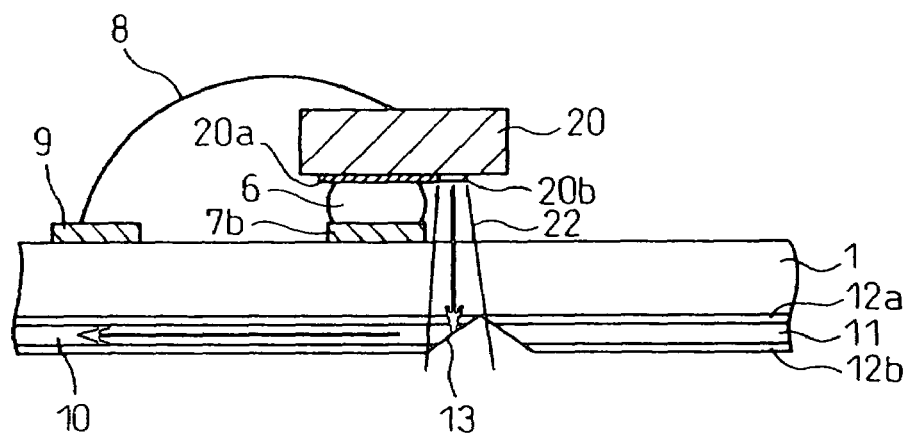
FIG. 1 is a sectional view showing a mounting structure for mounting a light emitting (light receiving) element on an optical wave-guide substrate.

FIG. 1 is an arrangement view showing a mounting structure of a surface light emitting (light receiving) semiconductor element.

In FIG. 1, the optical wave-guide substrate 1 is composed of a glass substrate through which a laser beam can be transmitted. On one face (lower face in FIG. 1) of the optical wave-guide substrate 1, there is provided an optical wave-guide 10. The optical wave-guide 10 includes: a core 11 through which a laser beam passes; and a clad 12 (under-clad 12a and over-clad 12b) arranged around the core 11. The optical wave-guide substrate 1 is provided with a V-shaped groove mirror 13 for reflecting a laser beam.

The conventional method is described as follows. As shown in FIG. 1, the light emitting (receiving) element 20 is mounted on the optical wave-guide substrate 1 in such a manner that the electrode 20a, which is provided on the side of the light emitting section 20b, and the substrate pad 7b, which is arranged on the side of the optical wave-guide substrate 1, are joined to each other by the solder bump 6, and the electrode arranged on the reverse side (upper face shown in FIG. 1) of the light emitting (receiving) element 20 is joined to the electrode pad 9 on the optical wave-guide substrate 1.

The light emitting (light receiving) element 20 emits a laser beam from its light emitting section 20b, and the thus emitted laser beam is reflected by the V-shaped groove mirror section 13 and passes through the core section 11 of the optical wave-guide 10. In the case where the element 20 is a light receiving element, a laser beam passes through the core section 11 of the optical wave-guide 10 and is then reflected by the V-shaped groove mirror section 13. The thus reflected laser beam is received by the light receiving section of the light receiving element.

In this connection, unless the distance between the light emitting section 21 of the light emitting (light receiving) element 20 and the optical wave-guide 10 is sufficiently accurately regulated, the transmitting efficiency of a laser beam and other characteristics are greatly affected. That is, a laser beam emitted from the light emitting section 21 of the light emitting (light receiving) element 20 is extended by a certain extent as shown in the drawing. Therefore, if the light emitting section 21 and the optical wave-guide 10 are too distant from each other, the extended laser beam 22 is not totally reflected on the V-shaped groove mirror section 13, which deteriorates the transmitting efficiency of a laser beam. Conventionally, the light emitting section 20 and the optical wave-guide substrate 1 are joined to each other by the solder bump 6. Therefore, it is impossible to highly accurately control the distance between the light emitting section 21 and the optical wave-guide 10 because the solder bump is soft and easily deformed.

It is impossible to arrange the light emitting section 20b and the optical wave-guide 10 too close to each other. When the light emitting section 20b and the optical wave-guide 10 are arranged too distant from each other, the ratio of transmission of a laser beam is deteriorated as described before and, further, problems are caused in which a gap formed between the light emitting section 21 and the optical wave-guide substrate 1 gets clogged with dirt and dust. When the light emitting element 20 and the optical wave-guide substrate 1 are arranged very close to each other, damage may be caused to the surface of the optical wave-guide substrate 1 by the light emitting element 20.

Figure 2:
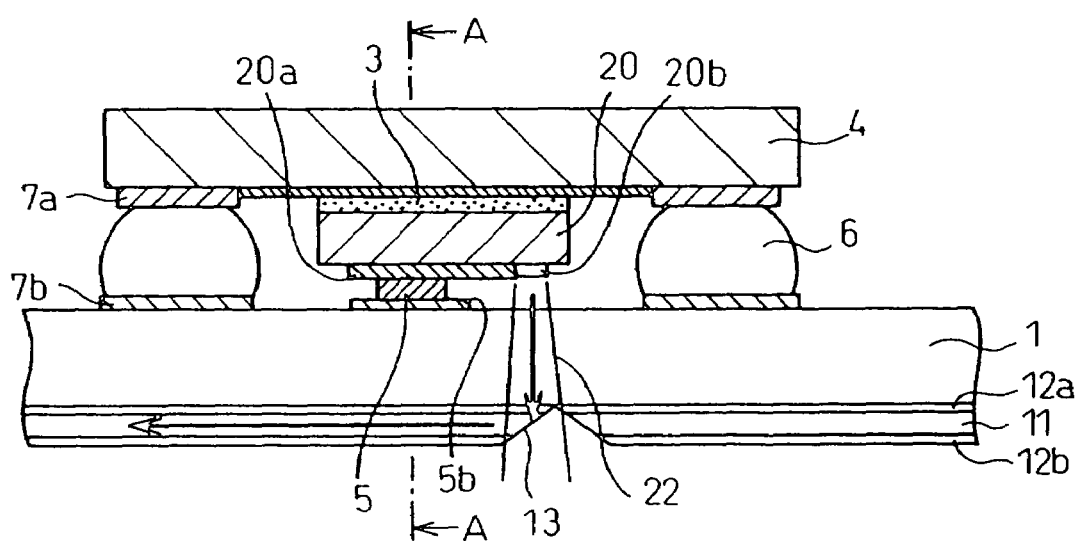
FIG. 2 is a sectional view showing a mounting structure of the present invention for mounting a light emitting (light receiving) element on an optical wave-guide substrate in which a sub-mount chip is used.

FIG. 2 is a sectional view showing a state in which a light emitting (light receiving) element of an embodiment of the present invention is mounted on an optical wave-guide substrate.

In FIG. 2, the structure of the optical wave-guide substrate 1 itself is the same as that of the conventional example shown in FIG. 1. The optical wave-guide substrate 1 is composed of a glass substrate through which a laser beam can be transmitted, and the optical wave-guide 10 is formed on one face (lower face in FIG. 2) of the optical wave-guide substrate 1. The optical wave-guide 10 includes: a core 11 through which a laser beam can pass; and a clad (under-clad 12a and over-clad 12b) arranged around the core 11. The optical wave-guide 10 is provided with the V-shaped groove mirror 13 on which the laser beam is reflected. The optical wave-guide substrate 1 and the optical wave-guide 10 are extended in the direction of the optical path.

As explained in detail later, in the present invention, on the other face (upper face shown in FIG. 2) of the optical wave-guide substrate 1, there are provided solder bumps 7b for positioning the light emitting (light receiving) elements 20 at positions corresponding to the four corners of a rectangle. There is provided a rigid post 5 for regulating at interval between the light emitting (light receiving) element 20 and the optical wave-guide 10 at a position corresponding to the electrode 20a of the light emitting (light receiving) element 20 to be joined.

A face (upper face shown in FIG. 2) of the light emitting (light receiving) element 20 opposite to the side of the light emitting section 20b is joined to the sub-mount chip 4 via conductive adhesive or the solder 3. On the sub-mount chip 4, there are provided solder bump joining pads 7a for positioning the light emitting (light receiving) elements 20 at positions corresponding to the solder bumps 7b, that is, at four positions corresponding to the corners of a rectangle. On these joining pads 7a, there are provided solder bumps 6 for positioning the light emitting (light receiving) element 20.

Under the above condition, the sub-mount chip 4 is subjected to flip chip bonding in a face-down manner while the side of the light emitting (light receiving) element 20 is directed downward, that is, the side of the light emitting (light receiving) element 20 is directed toward the optical wave-guide substrate 1. When the solder bumps 6 are melted, the sub-mount chip 4 is joined onto the optical wave-guide substrate 1. In this case of flip chip bonding, the plated post 5 is joined to the electrode 20a arranged on the same face as that of the light emitting section 20b of the light emitting (light receiving) element 20.

Due to the above flip chip bonding, the optical wave-guide substrate 1 and the sub-mount chip 4 are mechanically and physically joined to each other. At the same time, the pads 7a and 7b are joined to each other via the solder bump 6 for positioning and, on the other hand, the electrode 20b of the light emitting (light receiving) element 20 and the pad 5b on the optical wave-guide substrate 1 are electrically joined to each other via the plated post 5. For example, one is used as P-pole and the other is used as N-pole, and electric power is supplied to the light emitting (light receiving) element 20.

In the present invention, the post 5 is formed by means of copper plating as described later. Therefore, the rigidity of the post 5 is sufficiently high and, further, the height of the post 5 can be relatively accurately regulated. Accordingly, after the completion of flip chip bonding, it is possible to sufficiently accurately regulate a distance between the light emitting (light receiving) element 20 and the optical wave-guide substrate 1.

The light emitting (light receiving) element 20 emits a laser beam from its light emitting section 21. The thus emitted laser beam is reflected by the V-shaped groove mirror 13 and passes through the core section 11 of the optical wave-guide 10. In the case where the element 20 is a light receiving element, a laser beam passes through the core section 11 of the optical wave-guide 10 and is reflected by the V-shaped groove mirror 13, and the thus reflected laser beam is transmitted by the optical wave-guide 10 (core layer 11a).

As described above, in the present invention, a distance between the light emitting (light receiving) element 20 and the optical wave-guide substrate 1 can be sufficiently accurately regulated by the rigid plated post 5. Accordingly, even if the laser beam emitted from the light emitting section 21 of the light emitting (light receiving) element 20 is extended by a certain extent as shown in the drawing, the laser beam can be set at a position at which the laser beam 22 can be totally reflected on the V-shaped groove mirror 13. Therefore, the laser beam transmission efficiency can be enhanced.

Figure 3:
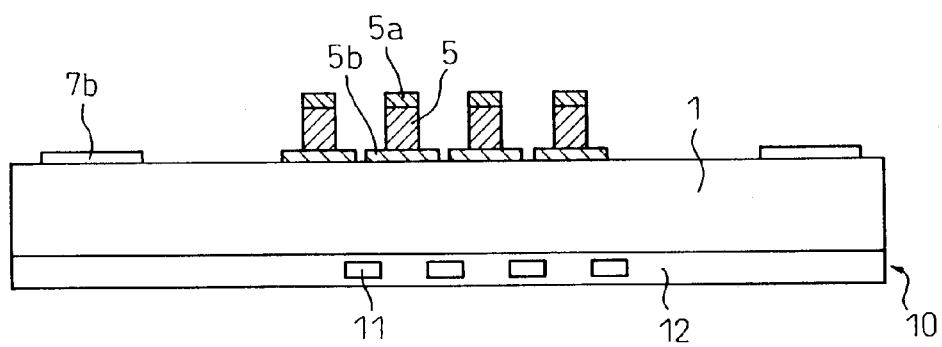
FIG. 3 is a sectional view showing an outline taken on line A—A in FIG. 2.

FIG. 3 is a sectional view taken on line A—A in FIG. 2.

In this embodiment, four posts 5 are arranged on an upper face of the optical wave-guide substrate 1 at regular intervals in the lateral direction corresponding to the four electrodes 20a of the light emitting (light receiving) element 20 described later. In this connection, reference numeral 5a is a solder plating layer, and reference numeral 5b is an electrode or a bonding pad provided on the optical wave-guide substrate 1. Reference numeral 7b is a bonding pad used for the solder bump 6 (shown in FIG. 2) for positioning.

In this embodiment, the optical wave-guide 10 arranged on a lower face of the optical wave-guide substrate 1 includes four cores 11, through which a laser beam passes, which are arranged at regular intervals in the lateral direction corresponding to the positions of the four light emitting (light receiving) sections 20b (shown in FIG. 8) of the light emitting (light receiving) elements 20. Regions between the cores 11 and the upper and lower layers of the cores 11 are clad portions 12. As the arrangement of each light emitting (light receiving) element 20 and the arrangement of the electrode 20a corresponding to it are shifted from each other as shown in FIG. 8, the arrangements of the four rows of the cores 11 are offset from the positions of the posts 4 corresponding to them.

Figure 4A:
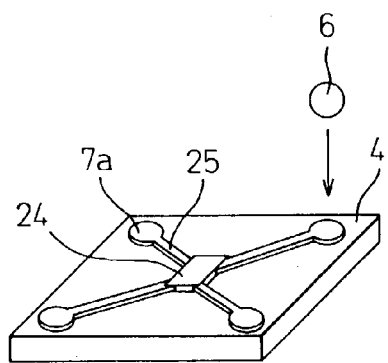
FIGS. 4(a) and 4(b) are views showing a process of manufacturing a sub-mount chip.
Figure 4B:
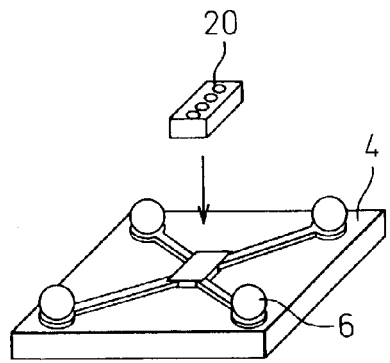

FIGS. 4(a) and 4(b) are views showing a manufacturing process of the sub-mount chip 4.

In the sub-mount chip 4, there is provided a rectangular stage section 24 for mounting the light emitting (light receiving) element 20 at the center of one face (upper face in the drawing) of the substrate. The conductive pattern 25 is radially extended from this stage section 24 to four corners. At a position close to each corner, there is provided a substantially circular pad 7b used for the solder bump 6 for positioning. The stage section 24, conductive pattern 25 and pad 7b are integrally formed and electrically communicated with each other and may have the same thickness.

In the first process shown in FIG. 4(a), the solder bumps 6 for positioning are temporarily attached onto the four pads 7b on the substrate. In this connection, the solder bumps 6 may be plated bumps or transferred bumps.

In the next process shown in FIG. 4(b), the light emitting (light receiving) element 20 is fixed onto the stage section 24 on the substrate. When the light emitting (light receiving) element 20 is fixed in this process, a conductor such as conductive adhesive or solder 3 is intervened between the light emitting (light receiving) element 20 and the stage section 24.

FIG. 5 is a view showing a manufacturing process of the optical wave-guide substrate.

First, a glass substrate 1 is prepared as shown in FIG. 5(a). Next, a seed layer 30 is formed which functions as an electrode when plating is conducted on all the face of the glass substrate 1 in the later process as shown in FIG. 5(b). Then, a dry film resist (DFR) 32 is patterned in a region except for a portion which is plated in the later process as shown in FIG. 5(c) Then, for example, copper (Cu) plating 34 is conducted on the pattern in the region to be plated as shown in FIG. 5(d). After the resist 32 is peeled off, conductive etching is performed so as to form a conductive pattern as shown in FIG. 5(e). Next, patterning of the insulating layer 36 is performed, and a region, except for the position in which the receiving land 5a is formed, is covered with the insulating layer 36 as shown in FIG. 5(f). Next, the seed layer 38 is formed in all regions including the region in which the insulating layer 36 is patterned as shown in FIG. 5(g). Next, a region except for the position at which the post receiving land 5a is formed is covered with the dry film resist (receiving land pattern) 42, and electrolytic copper plating is performed by using the seed layer 38 as an electrode, so that the post receiving land 5a is formed as shown in FIG. 5(h). Next, after the resist has been peeled off, a region except for the position at which the post is formed is covered with the dry film resist (copper post pattern) 43, and electrolytic copper plating and junction metal plating are performed as shown in FIG. 5(i). Next, the resist is peeled off, and the copper post is left by etching, and the above seed layer 38 is peeled off as shown in FIG. 5(j). Next, the substrate 1 is turned over, and the wave-guide 10 is formed on a substrate face on the side opposite to the side on which the post 5 is formed. This wave-guide 10 is composed of the core layer 11 and the clad layer 12 as described above. First, the under-clad layer 12a is formed, and then the core layer 11 is patterned, and finally the over-clad layer 12b is formed as shown in FIG. 5(k). In the final process, the V-shaped mirror section 13 is formed in the wave-guide 10.

Figure 6:
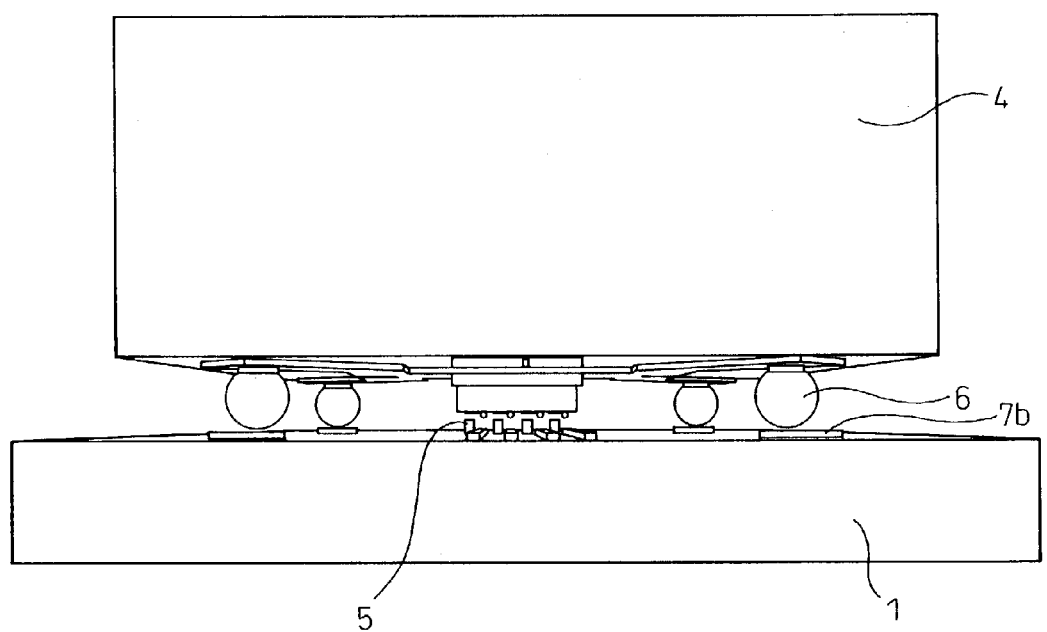
FIG. 6 is a perspective view showing a state in which a sub-mount chip is mounted on an optical wave-guide substrate.

FIG. 6 is a view showing a state in which the sub-mount chip 4 is joined to the optical wave-guide substrate 1. The sub-mount chip 4 manufactured by the manufacturing process shown in FIG. 4 is joined to the optical wave-guide substrate 1 manufactured by the manufacturing process shown in FIG. 5 as follows. First, positioning is performed so that the solder bump 6 for positioning can be positioned at the pad 7b of the optical wave-guide substrate 1. When the solder bump 6 is made to reflow by the flip flop bonding system, the solder bump 6 is joined to the pad 7b on the optical wave-guide substrate 1. At this time, the post 5 is aligned with the portion of the electrode 20a of the light emitting (light receiving) element 20, and the solder plating layer 5a shown in FIG. 3 provided on the post 5 is simultaneously made to reflow, and both are joined to each other.

Figure 7:
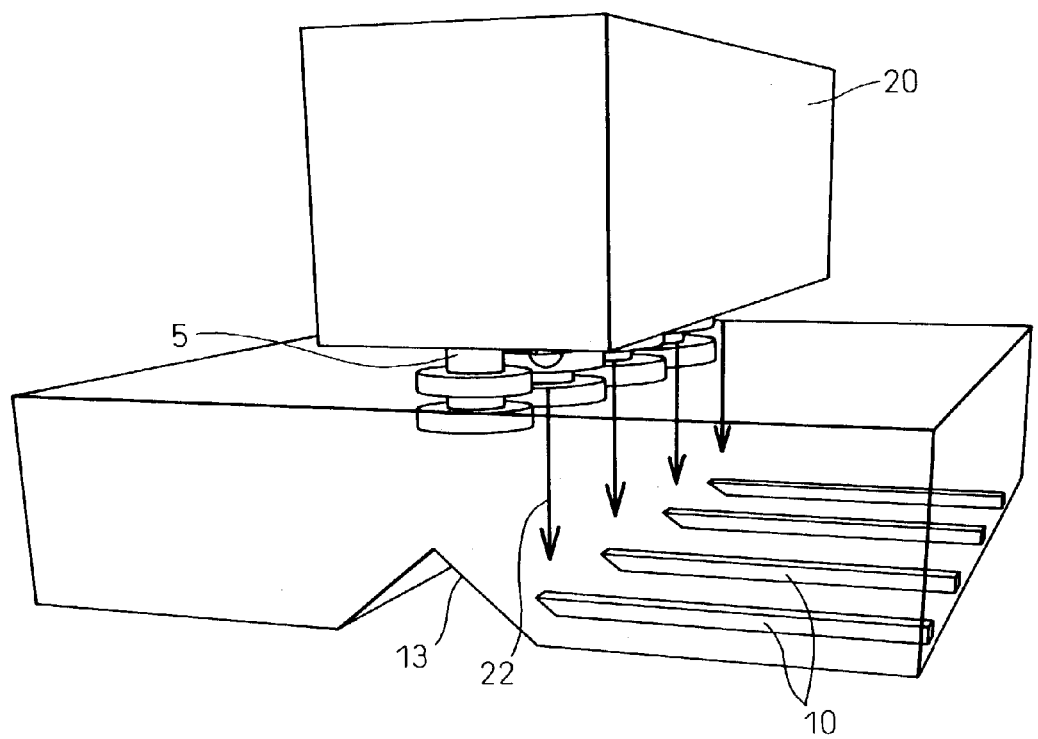
FIG. 7 is a perspective view showing a joining section of joining an optical wave-guide substrate to a light emitting (light receiving) element in detail.

FIG. 7 is a perspective view showing the detail of the joining section in which the optical wave-guide substrate and the light emitting (light receiving) element are joined to each other. When the sub-mount chip 4 is joined to the optical wave-guide substrate 1 as described above, the light emitting (light receiving), element 20 can be joined to the optical wave-guide substrate 1. In the above condition, the post 5 on the optical wave-guide substrate 1 side is aligned and joined with the electrode 20a of the light emitting (light receiving) element 20. On the other hand, the light emitting (light receiving) section 20b of the light emitting (light receiving) element 20 is accurately aligned with the position of the V-shaped groove mirror 13. The light emitting element 20 emits a laser beam from its light emitting section 20b. The thus emitted laser beam is reflected by the V-shaped groove mirror 13 and passes through the core section 11 of the optical wave-guide 10.

Figure 8A:
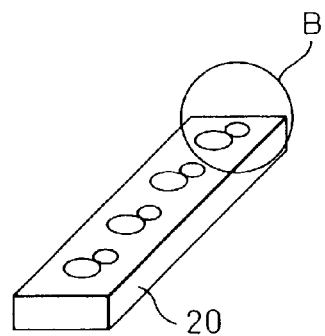
FIG. 8(a) is a perspective view showing an outline of a light emitting (light receiving) element.
Figure 8B:
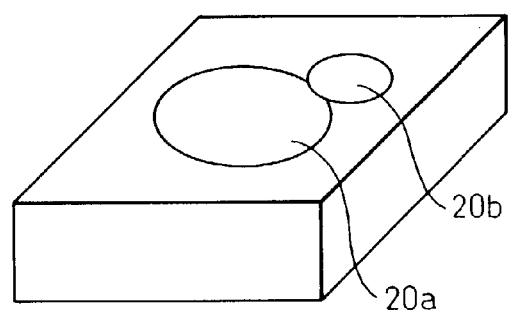
FIG. 8(b) is a perspective view showing a portion of the light emitting (light receiving) element in detail.

FIG. 8(a) is a perspective view showing an outline of the light emitting (light receiving) element, and FIG. 8(b) is a perspective view showing a portion of the light emitting (light receiving) element in detail. As shown in the drawing, four light emitting (light receiving) sections 20b are arranged in one light emitting (light receiving) element 2 at regular intervals. On the other hand, four electrodes 20a are also arranged with respect to one light emitting (light receiving) element 2 at the same intervals as those of the light emitting (light receiving) section 20b. The light emitting (light receiving) section 20b is offset to an oblique position with respect to the aligning direction of the electrode 20a, so that the position of the light emitting (light receiving) section 20b can be aligned with the position of the V-shaped groove mirror section 13.

Figure 9:
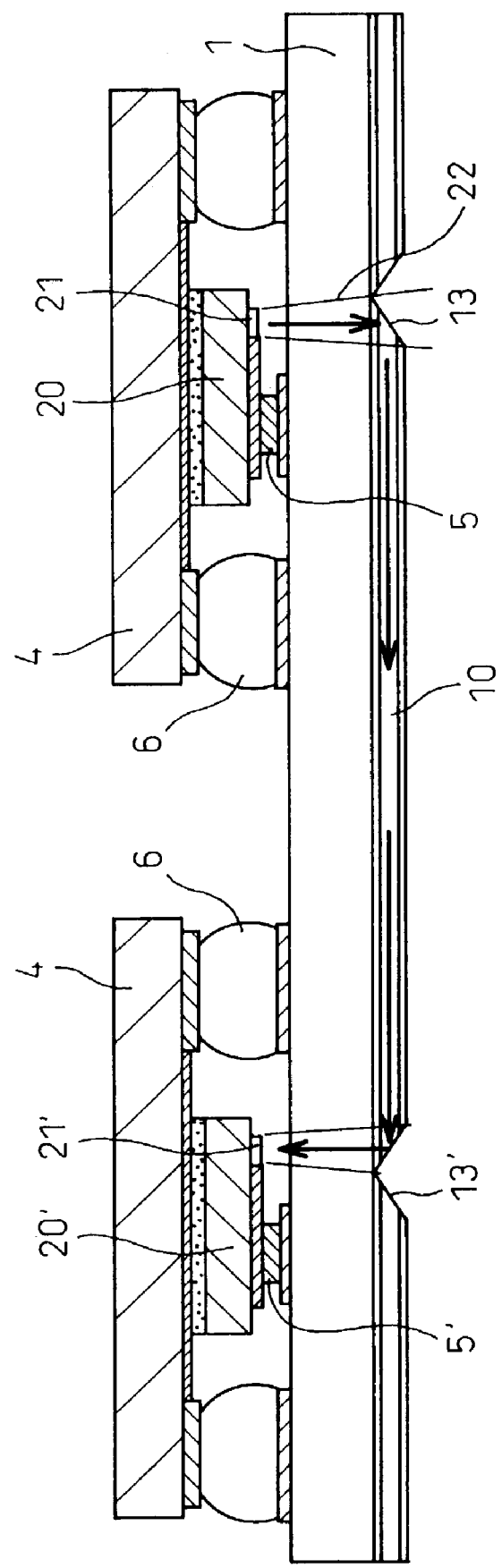
FIG. 9 is a sectional view of an optical transmitting device provided with a light emitting element and light receiving element.

FIG. 9 is a sectional view of an optical transmitting device provided with a light emitting element and light receiving element. In FIG. 9, the structure shown on the right is the same as the structure on the light emitting side shown in FIG. 2. The optical wave-guide substrate 1 extends to the left in the drawing, and the light receiving element 20' is attached at a position distant from the position of the light emitting element 20.

In the same manner as that of the light emitting element 20, the light receiving element 20' is made to reflow and is joined to the optical wave-guide substrate 1 by the solder bump 6 for positioning by the flip chip bonding system. The light receiving section 21' of the light receiving element 20' is arranged symmetrically with the light emitting section 21 of the light emitting element 20. In the same manner as that of the light emitting element 20, the light receiving section 21' is arranged at a position corresponding to the position of the V-shaped groove mirror 13' on the other side of the optical wave-guide 10 on the optical wave-guide substrate 1.

A laser beam emitted from the light emitting section 21 of the light emitting element 20 is reflected by one V-shaped groove mirror 13 and passes through the core section 11 of the optical wave-guide 10. This laser beam is reflected by the other V-shaped groove mirror 13' and is received by the light receiving section 21' of the light receiving element 20'.

Figure 10:
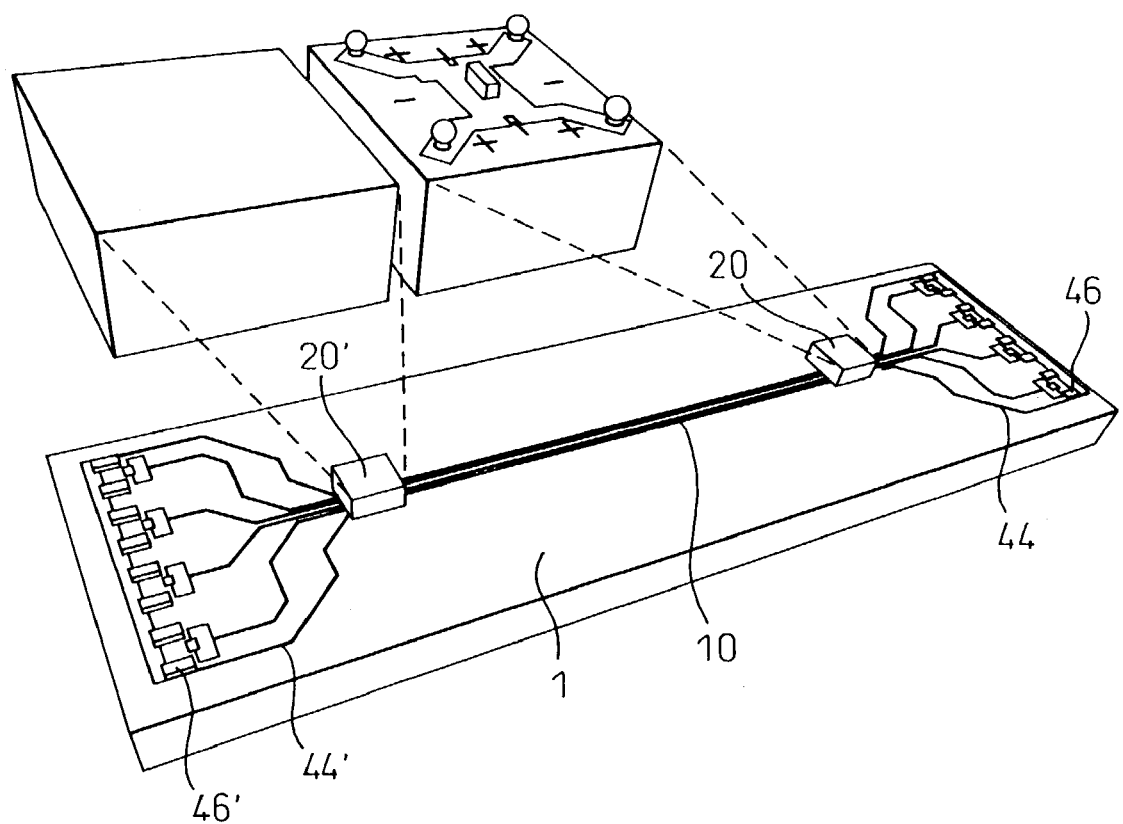
FIG. 10 is a perspective view showing an example of an optical transmitting module.

FIG. 10 is a perspective view showing a light transmitting module having a structure corresponding to the light transmitting device shown in FIG. 9. In FIG. 10, reference numeral 1 is an optical wave-guide substrate, reference numeral 10 is an optical wave-guide, reference numeral 20 is a light emitting element, reference numeral 20' is a light receiving element, reference numerals 44 and 44' are wires, and reference numerals 46 and 46' are terminals.

As explained above, according to the present invention, the surface light emitting type light emitting (light receiving) element can be joined by a C4-junction to the optical wave guide substrate while being handled as a common flip chip. In the junction, highly accurate position control (not more than 5 μm) and height control (not more than 10 μm) can be simultaneously realized by the self alignment function in the melting process of solder bump for positioning formed on the sub-mount chip and also by the stand-off function of the copper (Cu) post formed on the substrate pad. Therefore, the distance of transmitting light from the light emitting (light receiving) element to a portion right below the substrate can be reduced to 1/5 compared with the distance in the case of using the conventional solder bump.

An embodiment of the present invention has been explained above referring to the accompanying drawings. However, it should be noted that the present invention is not limited to the above specific embodiment. Variations or modifications may be made by one skilled in the art without departing from the spirit and scope of the present invention as defined by the accompanying claims.

What is claimed is:

1. A printed board unit comprising:
    a light emitting or light receiving element;
    a sub-mount chip on which the light emitting or light receiving element is mounted;
    an optical wave-guide substrate;
    joining member for joining the light emitting or light receiving element to the optical wave-guide substrate, the joining member arranged between the sub-mount chip and the optical wave-guide substrate when the sub-mount chip is joined to the optical wave-guide substrate while the light emitting or light receiving element faces toward the optical wave-guide substrate; and
    a post arranged between the light emitting or light receiving element and the optical wave-guide substrate for regulating an interval between them and for providing an electrical connection therebetween.

2. A printed board unit according to claim 1, wherein the light emitting element is mounted on one side of a surface of the optical wave-guide substrate and the light receiving element is mounted on the other side of the same surface of the optical wave-guide substrate, and at least one of the light emitting element and light receiving element or both the light emitting element and light receiving element are joined to the optical wave-guide substrate via the sub-mount chip.

3. A printed board unit according to claim 1, wherein the joining member arranged between the sub-mount chip and the optical wave-guide substrate is solder bumps for positioning the light emitting or light receiving element and the optical wave-guide, so that highly accurate position control can be realized by a self-alignment function when the solder bumps are melted.

4. A printed board unit according to claim 3, wherein the light emitting or light receiving element has an electrode which is electrically connected to an electrode of the sub-mount chip, which is further connected to the solder bumps for positioning the light emitting or light receiving element with respect to the optical wave-guide substrate, so that the solder bumps can also be used as electrodes.

5. A printed board unit according to claim 1, wherein the post arranged between the light emitting or light receiving element and the optical wave-guide substrate, so as to regulate the interval between them, is a rigid post formed by means of plating conductive metal.

6. A printed board unit according to claim 1, wherein the sub-mount chip is joined to the optical wave-guide substrate by means of a face-down C4 junction of a flip chip bonding.

7. A printed board unit according to claim 1, said unit further comprising a plated layer formed on a surface of the post, which is made of copper, for connecting the light emitting or light receiving element with the optical wave-guide substrate, wherein a melting point of the plated layer is identical with or not more than a melting point of the solder bump for connecting the sub-mount chip with the optical wave-guide substrate.

8. A method of mounting a semiconductor element for light transmission consisting of light emitting or light receiving element, said method comprising the following steps of:
    mounting a light emitting or light receiving element on a sub-mount chip and also mounting solder bumps on respective contact pads of the sub-mount chip;
    preparing an optical wave-guide substrate provided with a post at a position corresponding to a position where the light emitting or light receiving element is joined;

arranging the sub-mount chip on the optical wave-guide substrate in such a manner that the light emitting or light receiving element faces toward the optical wave-guide substrate;

joining the light emitting or light receiving element to the optical wave-guide substrate by a reflow process so that the sub-mount chip is joined to optical wave-guide substrate by means of solder balls and the post is joined to the light emitting or light receiving element so as to electrically connect, and regulate the interval between, the light emitting or light receiving element and the optical wave-guide substrate.

* * * * *